US012612694B2

(12) United States Patent
Cabrera et al.

(10) Patent No.: US 12,612,694 B2
(45) Date of Patent: Apr. 28, 2026

(54) METHODS AND SYSTEMS FOR FILLING GAP FEATURES ON SUBSTRATE SURFACES

(71) Applicant: ASM IP Holding B.V., Almere (NL)

(72) Inventors: Yasiel Cabrera, Phoenix, AZ (US); YoungChol Byun, Tempe, AZ (US); Arul Vigneswar Ravichandran, Tempe, AZ (US); Salvatore Luiso, Tempe, AZ (US); Sang Ho Yu, Cupertino, CA (US); Moataz Bellah Mousa, Chandler, AZ (US)

(73) Assignee: ASM IP Holding B.V., Almere (NL)

( * ) Notice: Subject to any disclaimer, the term of this patent is extended or adjusted under 35 U.S.C. 154(b) by 494 days.

(21) Appl. No.: 18/119,884

(22) Filed: Mar. 10, 2023

(65) Prior Publication Data

US 2023/0295795 A1　　Sep. 21, 2023

Related U.S. Application Data

(60) Provisional application No. 63/320,032, filed on Mar. 15, 2022.

(51) Int. Cl.
| | |
|---|---|
| *C23C 16/04* | (2006.01) |
| *C23C 16/30* | (2006.01) |
| *C23C 16/56* | (2006.01) |
| *H01J 37/32* | (2006.01) |

(52) U.S. Cl.
CPC .......... *C23C 16/045* (2013.01); *C23C 16/303* (2013.01); *C23C 16/56* (2013.01); *H01J 37/32357* (2013.01); *H01J 37/32853* (2013.01); *H01J 2237/3321* (2013.01); *H01J 2237/335* (2013.01)

(58) Field of Classification Search
None
See application file for complete search history.

(56) References Cited

U.S. PATENT DOCUMENTS

| | | |
|---|---|---|
| 10,134,580 B1 | 11/2018 | Licausi |
| 10,741,385 B2 | 8/2020 | Pore |
| 10,756,110 B1 | 8/2020 | Sharangpani |
| 11,094,582 B2 | 8/2021 | Zhu |
| 11,286,558 B2 | 3/2022 | Stevens |
| 11,295,980 B2 | 4/2022 | Zope |
| 11,393,690 B2 | 7/2022 | Zhu |
| 11,447,864 B2 | 9/2022 | Fluit |

(Continued)

FOREIGN PATENT DOCUMENTS

| | | |
|---|---|---|
| CN | 111146143 A | 5/2020 |
| EP | 1334512 A1 | 8/2003 |

(Continued)

*Primary Examiner* — Jason Berman
(74) *Attorney, Agent, or Firm* — Snell & Wilmer L.L.P.

(57) ABSTRACT

Methods and systems for forming a structure are disclosed. Exemplary methods include providing a substrate comprising a gap within a reaction chamber, selectively depositing a first material comprising molybdenum on a first surface within the gap relative to a second surface within the gap to at least partially fill the gap, and after the step of selectively depositing the first material comprising molybdenum, conformally depositing a second material comprising molybdenum over the first surface and the second surface.

20 Claims, 6 Drawing Sheets

(56) References Cited

U.S. PATENT DOCUMENTS

| 2019/0067095 | A1 |   | 2/2019 | Zhu |
| 2021/0285102 | A1 |   | 9/2021 | Yoon |
| 2022/0285211 | A1 |   | 9/2022 | Färm |
| 2022/0328317 | A1 | * | 10/2022 | Na ................... C23C 16/45553 |

FOREIGN PATENT DOCUMENTS

| WO | 02078059 | A1 | 10/2002 |
| WO | 2005074025 | A2 | 8/2005 |
| WO | 2020106649 | A1 | 5/2020 |
| WO | 2020197597 | A1 | 10/2020 |
| WO | 2021173172 | A1 | 9/2021 |

* cited by examiner

METHODS AND SYSTEMS FOR FILLING GAP FEATURES ON SUBSTRATE SURFACES

CROSS-REFERENCE TO RELATED APPLICATIONS

This application is a nonprovisional of, and claims priority to and the benefit of, U.S. Provisional Patent Application No. 63/320,032, filed Mar. 15, 2022 and entitled "METHODS AND SYSTEMS FOR FILLING GAP FEATURES ON SUBSTRATE SURFACES," which is hereby incorporated by reference herein.

FIELD OF INVENTION

The present disclosure generally relates to methods of depositing material on a substrate surface. More particularly, the disclosure relates to methods for depositing material within a gap on the substrate surface.

BACKGROUND OF THE DISCLOSURE

During the formation of devices, such as semiconductor devices, it is often desirable to form patterned features on a surface of a substrate. Typically, to form patterned features, a layer of material is deposited, the deposited layer is then patterned using, for example, photolithography techniques, and then a portion of the deposited layer is etched to formed features, including the material.

A particular process used in the formation of electronic devices includes a gap fill process, in which material, such as metal, is deposited on a surface of a substrate, including within gaps on the substrate surface. Excess material on the surface of the substrate—not within the gap—can be subsequently removed. As device features continue to decrease in size and high aspect ratio gaps have become common, it has become increasingly difficult to fill gaps with a metal having the desired properties.

For example, for many front end of line (FEOL), middle of line (MOL) and back end of line (BEOL) processes, it is desirable to fill gaps with material that exhibits relatively low contact resistance. Typical techniques to deposit material within a gap can lead to undesirably high contact resistance and/or undesirably high variation in contact resistance. Some techniques to deposit material within a gap can also lead to issues with subsequent processing steps in the formation of devices. Accordingly, improved methods for depositing material within a gap on a substrate surface are desired.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary is provided to introduce a selection of concepts in a simplified form. These concepts are described in further detail in the detailed description of exemplary embodiments of the disclosure below. This summary is not intended to necessarily identify key features or essential features of the claimed subject matter, nor is it intended to be used to limit the scope of the claimed subject matter.

Various embodiments of the present disclosure relate to methods of forming structures suitable for use in forming electronic devices. While the ways in which various embodiments of the present disclosure address drawbacks of prior methods and structures are discussed in more detail below, in general, embodiments of the disclosure provide improved methods that include a selective deposition step and a conformal deposition step to at least partially fill a gap on a substrate surface. As set forth in more detail below, in some cases, the selective deposition and the conformal deposition can be performed using a single recipe, which can be tuned to selectively or conformally fill the gap to a desired amount.

In accordance with embodiments of the disclosure, a method of forming a structure is provided. Exemplary methods include providing a substrate within a reaction chamber. The substrate can include a gap that includes a volume, a first surface (e.g., at a bottom of the gap) and a second surface (e.g., on a sidewall of the gap and on a top surface of the substrate). Exemplary methods further include selectively depositing a first material comprising molybdenum on the first surface relative to the second surface to at least partially fill the gap and after the step of selectively depositing the first material comprising molybdenum, conformally depositing a second material comprising molybdenum over the first surface and the second surface. In accordance with examples of the disclosure, the first surface comprises a metal and/or a metal nitride. The second surface can include a dielectric material, such as an (e.g., silicon or metal) oxide or nitride. In some cases, the dielectric material can be or include a low-k dielectric material. In accordance with additional examples, the step of selectively depositing the first material includes a cyclical process that includes: providing a first molybdenum precursor to the reaction chamber and providing a first reactant to the reaction chamber. A first dose ratio of a dose of the first reactant to a dose of the first molybdenum precursor can be between about 10 and about $10^6$ or about 2000 to about 5000 to facilitate selective deposition of molybdenum overlying the first surface. In accordance with additional examples, the step of conformally depositing the second material includes a cyclical process that includes: providing a second molybdenum precursor to the reaction chamber and providing a second reactant to the reaction chamber, wherein second dose ratio of a dose of the second reactant to a dose of the second molybdenum precursor is between about 500 and about 500,000 or between about 5000 and about 50,000. The first and second ratios can be the same or can differ. As discussed in more detail below, in some cases, the step of selectively depositing the first material and the step of conformally depositing the second material can be substantially the same, such that the process automatically switches from selective to conformal deposition. In accordance with examples of these embodiments, the method includes a pulsed CVD method, wherein the reactant can be continually flowed to the reaction chamber, and the molybdenum precursor is pulsed to the reaction chamber. In these cases, a dose of the molybdenum precursor can be controlled, at least in part, by controlling a pulse time of the molybdenum precursor. In accordance with further examples, a method can include cleaning the surface of the substrate prior to the step of selectively depositing the first material. The cleaning can be a thermal and/or a plasma process.

In accordance with additional examples of the disclosure, a structure is provided. Exemplary structures include a substrate comprising a gap, the gap comprising a volume, a bottom surface, a side surface adjacent the bottom surface, and a top surface on the uppermost surface of the substrate.

The bottom surface can comprise a first material and the side surface (and in some cases the top surface) can comprise a second material different than the first material. The structure further includes a first molybdenum layer selectively formed overlying the first surface within the gap, the first molybdenum layer comprising a first grain size and filling about 10 to about 50 or about 50 to about 100 percent of the volume; and a second molybdenum layer conformally formed overlying the first molybdenum layer, the second molybdenum layer comprising a second grain size different than the first grain size.

In accordance with yet additional examples of the disclosure, a system for filling a gap on a surface of a substrate is provided. An exemplary system includes a controller configured to operate a first flow control valve and a second flow control valve, a molybdenum precursor source connected to the first flow control valve, a reactant source connected to the second flow control valve, and a reaction chamber coupled downstream from the first and second flow control valves. The reaction chamber can be configured to, responsive to the controller, receive a molybdenum precursor from the molybdenum precursor source and a reactant from the reactant source, selectively deposit a first material comprising molybdenum on a first surface at a bottom of a gap on a substrate relative to a second surface on a sidewall of the gap to at least partially fill the gap according to the received molybdenum precursor and the reactant, and after the step of selectively depositing the first material comprising molybdenum, conformally deposit a second material comprising molybdenum over the first surface and a second surface within the gap according to the received molybdenum precursor and the reactant. As noted above, by, for example, controlling relative doses of the precursor and reactant, in some cases, the steps of selectively deposit the first material and conformally deposit the second material are performed using a single recipe, which can be tuned to obtain desired fill percentages of selective and/or conformal deposition.

These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

DISCLOSURE

Figure 1:
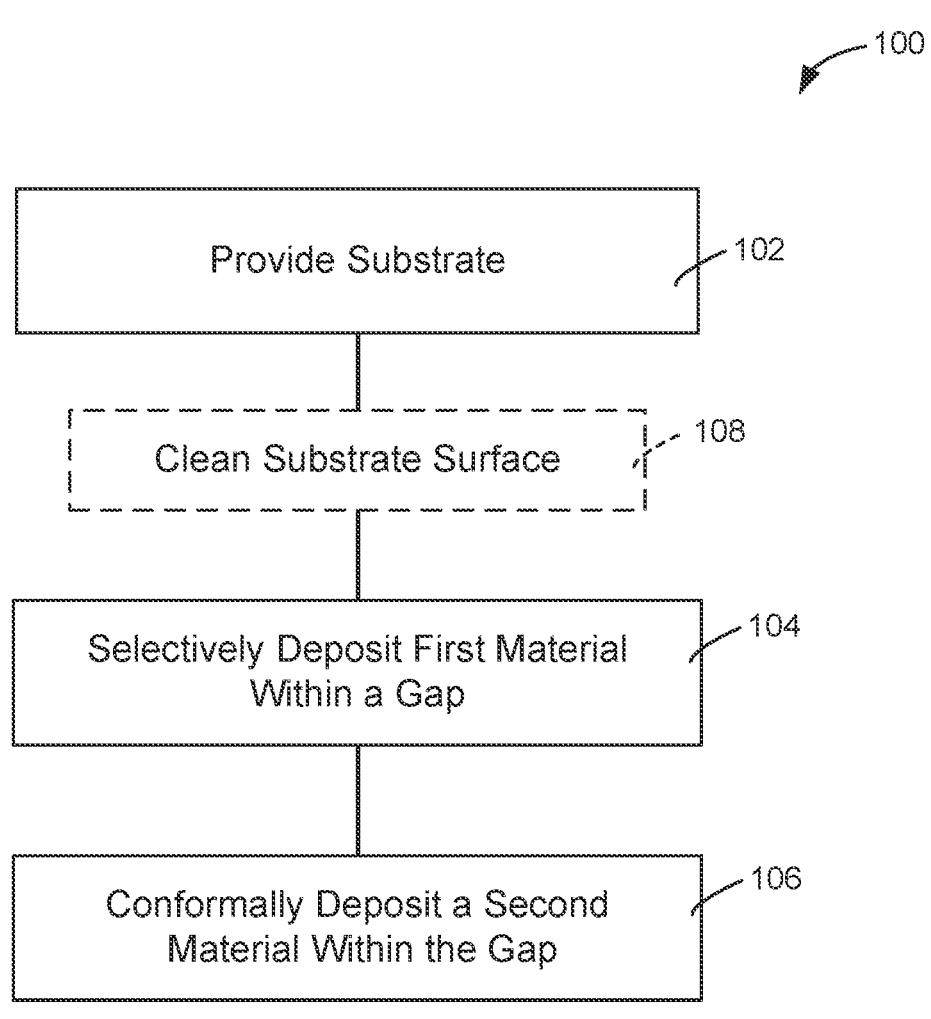
FIG. 1 illustrates a method in accordance with exemplary embodiments of the FIG. 2 illustrates a substrate including a gap for use in accordance with embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Moreover, recitation of multiple embodiments having stated features is not intended to exclude other embodiments having additional features or other embodiments incorporating different combinations of the stated features. Unless otherwise noted, the exemplary embodiments or components thereof may be combined in various combinations or may be applied separate from each other. The illustrations presented herein are not meant to be actual views of any particular material, structure, or device, but are merely idealized representations that are used to describe embodiments of the disclosure.

As set forth in more detail below, embodiments of the disclosure relate to a method of filling a gap on a surface of a substrate with material comprising molybdenum. Exemplary methods include at least partially filling the gap using a first, selective process and then using a second, conformal process to deposit a second material comprising molybdenum. The first and second material can be substantially the same (e.g., molybdenum metal) and can be represented by the same chemical formula (e.g., Mo). Use of a selective process followed by a conformal process allows for gap-fill material with desired properties, such as, for example, relatively low contact resistance. In addition, conformal deposition at or near a top of the gap provides desired adhesion between a sidewall of the gap and the deposited material. Further, using methods described herein, the gap can be filled without forming a seam in the deposited material. Additional advantages are discussed below.

Exemplary embodiments described herein may be particularly suitable for use in front end of line (FEOL), middle of line (MOL), and/or back end of line (BEOL) processes used to form electronic devices. For example, the methods can be used to deposit material comprising molybdenum that is suitable for applications, such as, for example, low electrical resistivity gap-fill layers for 3D-NAND and DRAM word-line features or as an interconnect material in CMOS logic applications. Exemplary methods provide molybdenum material in a gap that exhibits relatively low effective electrical resistivity and/or other desired properties noted herein.

In this disclosure, gas can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas, such as a rare gas. In some cases, the term precursor can refer to a compound that participates in the chemical reaction that produces another compound, and particularly to a compound that constitutes a film matrix or a main skeleton of a film; the term reactant can be used to refer to a gas that reacts with the precursor or derivative thereof to form a desired material (e.g., molybdenum metal). In some cases, the term reactant can be used interchangeably with the term precursor. The term inert gas can refer to a gas that does not take part in a chemical reaction and/or does not become a part of a film matrix to an appreciable extent. Exemplary inert gases include helium, argon, and any combination thereof.

As used herein, the term substrate can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of examples, a substrate can include bulk semiconductor material and an insulating or dielectric material layer overlying at least a portion of the bulk semiconductor material. As described in more detail below, the dielectric layer can include one or more gaps.

As used herein, the term film and/or layer can refer to any continuous or non-continuous structure and material, such as material deposited by the methods disclosed herein. For example, film and/or layer can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous.

As used herein, a structure can be or include a substrate as described herein. Structures can include features (e.g., gaps) and one or more layers overlying the features, such as one or more layers formed according to a method as described herein. A device can include or be formed using a structure.

As used herein, chemical vapor deposition (CVD) can refer to a vapor deposition process in which volatile precursors and/or reactants react and/or decompose on a surface of a substrate. During a typical CVD process, a precursor and a reactant can be flowed to a reaction chamber during an overlap period, during which both the precursor and the reactant are provided to the reaction chamber.

As used herein, the term cyclic deposition can refer to the sequential introduction of one or more precursors and/or reactants into a reaction chamber to deposit a film over a substrate and includes deposition techniques such as atomic layer deposition and cyclical chemical vapor deposition. In some cases, a cyclic deposition process can include continuously providing a reactant and/or an inert gas to a reaction chamber and pulsing a precursor to the reaction chamber. Such processes can be referred to as cyclical chemical vapor deposition or pulsed chemical vapor deposition.

As used herein, the term atomic layer deposition (ALD) may refer to a vapor deposition process in which deposition cycles, typically a plurality of consecutive deposition cycles, are conducted in a reaction chamber. Generally, during each cycle, the precursor is chemisorbed to a deposition surface (e.g., a substrate surface or a previously deposited underlying surface, such as material from a previous ALD cycle), forming a monolayer or sub-monolayer that does not readily react with additional precursor (i.e., a self-limiting reaction). Thereafter, a reactant may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. The term atomic layer deposition, as used herein, is meant to include processes designated by related terms, such as chemical vapor atomic layer deposition and the like when performed with alternating pulses of precursor composition(s), reactive gas, and purge (e.g., inert carrier) gas.

As used herein, the term molybdenum precursor refers to a precursor that comprises molybdenum.

As used herein, the term molybdenum halide precursor refers to a precursor that includes molybdenum and at least one halogen. The halogen can include one or more of chlorine, iodine, and bromine.

As used herein, the term molybdenum chalcogenide halide refers to a precursor that includes a molybdenum, a halogen, and a chalcogen. The chalcogen can include one or more of oxygen (O), sulfur (S), selenium (Se), and tellurium (Te).

As used herein, the term molybdenum oxyhalide refers to a precursor that includes molybdenum, oxygen, and at least one halogen.

As used herein, the term reducing agent can refer to a reactant that donates an electron to another species in a redox chemical reaction.

As used herein, the term gap can refer to an opening or cavity disposed between surfaces of a non-planar structure. The term gap can refer to an opening or cavity disposed between opposing inclined sidewalls of two protrusions extending vertically from the surface of the substrate or within an indentation (e.g., having a single sidewall) extending vertically into the surface of the substrate; such gaps can be referred to as vertical gaps. The sidewall can be substantially perpendicular to a surface (e.g., bottom and/or top) or can be sloped. The term gap can also refer to an opening or cavity disposed between two opposing substantially horizontal surfaces or between two opposing substantially horizontal portions of a surface, the horizontal surfaces bounding at least a portion of the horizontal opening or cavity; such gaps may be referred to as horizontal gaps. The sidewalls between the opposing substantially horizontal surfaces or portions can be perpendicular to the surfaces or portions or can be sloped.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" can refer independently to "typically or broadly comprising," "comprising," "consisting essentially of," or "consisting of" in some embodiments. In this disclosure, any defined meanings do not necessarily exclude ordinary and customary meanings.

Although a number of example materials are given throughout the embodiments of the current disclosure, it should be noted that the chemical formulas given for each of the example materials should not be construed as limiting and that the non-limiting example materials given should not be limited by a given example stoichiometry.

Turning now to the figures, FIG. 1 illustrates a method 100 of forming a structure in accordance with exemplary embodiments of the disclosure. Method 100 includes the steps of providing a substrate (102), selectively depositing a first material comprising molybdenum (104), conformally depositing a second material comprising molybdenum (106), and optionally cleaning a surface of the substrate (108). As set forth in more detail below, in some cases, the steps of selectively depositing a first material and conformally depositing a second material can include the same process recipe.

During step 102, a substrate is provided within a reaction chamber. The substrate can include any substrate as described herein. By way of particular examples, the substrate can be suitable for FEOL, MOL and/or BEOL processing.

The reaction chamber used during step 102 can be or include a reaction chamber of a chemical vapor deposition reactor system configured to perform a deposition process. The reaction chamber can be a standalone reaction chamber or part of a cluster tool or module.

Step 102 can include heating the substrate to a desired deposition temperature within the reaction chamber. In some embodiments of the disclosure, step 102 includes heating the substrate to a temperature of less than 550° C. (e.g., for FEOL or other (e.g., memory device) processes), 450° C. (e.g., for MOL processes), or 400° C. (e.g., for BEOL processes). For example, in some embodiments of the disclosure, heating the substrate to a deposition temperature includes heating the substrate to a temperature between approximately 20° C. and approximately 550° C., between about 20° C. and about 450° C., or between about 20° C. and about 400° C.

In addition to controlling the temperature of the substrate, a pressure within the reaction chamber may also be regulated. For example, in some embodiments of the disclosure, the pressure within the reaction chamber during step 102 may be less than 760 torr or between about 10 torr and about 200 torr.

Figure 2:
Figure 2:
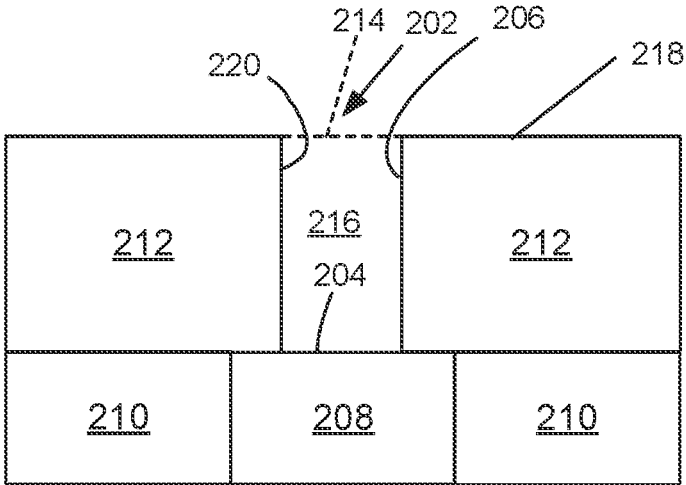

In accordance with examples of the disclosure, the substrate includes at least one gap. FIG. 2 illustrates a substrate 200 suitable for use during step 102. Substrate 200 includes a gap 202. Gap 202 includes a first surface 204 (e.g., at a bottom of the gap) and a second surface 206 (e.g., on a sidewall 220 of the gap and top surface 218 of substrate 200), and a volume 216. In the illustrated example, volume 216 is defined by first surface 204, second surface 206, and an imaginary line 214 across a top of gap 202.

Gap 202 is illustrated as a vertical gap. An aspect ratio (height:width) of gap 202 can be greater than 2:1, or greater than 5:1, or greater than 10:1, or greater than 25:1, or greater than 50:1, or even greater than 100:1. In some embodiments of the disclosure, the substrate may comprise one or more substantially horizontal gaps, wherein the horizontal gap may have an aspect ratio (height:width) which may be greater than 2:1, or greater than 5:1, or greater than 10:1, or greater than 25:1, or greater than 50:1. In some cases, the aspect ratio is less than 200:1, less than 150:1, less than 100:1 or less than 50:1.

In the illustrated example, substrate 200 includes a first insulating material 210 and a second insulating material 212. The first insulating material 210 and the second insulating material 212 can be the same or different. In accordance with examples of the disclosure, the first insulating material 210 and/or the second insulating material 212 can be or include a dielectric material, such as an oxide or a nitride, such as silicon oxide or silicon nitride, or low-k dielectric material, such as a metal oxide. In some embodiments, the first insulating material 210 and/or the second insulating material 212 can be or include one or more of silicon dioxide ($SiO_2$), non-stoichiometric silicon oxide, silicon nitride ($Si_3N_4$), non-stoichiometric silicon nitride, silicon oxynitride (SiON), silicon oxycarbide (SiOC), silicon oxycarbide nitride (SiOCN), silicon carbon nitride (SiCN), or the like. In some embodiments, the first insulating material 210 and/or the second insulating material 212 can be or include one or more of aluminum oxide ($Al_2O_3$), hafnium oxide ($HfO_2$), tantalum oxide ($Ta_2O_5$), zirconium oxide ($ZrO_2$), titanium oxide ($TiO_2$), hafnium silicate ($HfSiO_x$) which may be stoichiometric—or not, lanthanum oxide ($La_2O_3$), and the like.

As illustrated, second surface 206 can be a surface of the second insulating material 212. Further, second surface 206 can extend to a top surface 218 of insulating material 212 and/or of substrate 200.

In the illustrated example, the substrate 200 also includes a material 208 at a bottom of gap 202. The material 208 can be or include conductive material. The conductive material can be or include, for example, a metal, such as tungsten, molybdenum, or the like, and/or a metal nitride, such as tungsten nitride, titanium nitride, or the like. Surface 204 can be or include the same material as material 208.

Referring again to FIG. 1, step 104 includes selectively depositing a first material comprising molybdenum on a first surface (e.g., surface 204) relative to a second surface (e.g., surface 206) to at least partially fill the gap. Step 104 can include an ALD process, a CVD process, a cyclical CVD process, such as a pulsed CVD, or the like.

Step 104 can include providing a (e.g., first) molybdenum precursor and a (e.g., first) reactant (e.g., a reducing agent) to the reaction chamber. In accordance with examples of the disclosure, a relative dose of the reactant and the molybdenum precursor can be selected and controlled to obtain desired selectivity. To obtain desired selectivity, a (e.g., first) dose ratio of a dose of the first reactant to a dose of the first molybdenum precursor can be between about 10 and about $10^6$ or between about 2000 and about 5000. As used herein, a dose can be defined as torr*seconds for a precursor or reactant. Relative dosing can be varied to obtain desired form of deposition—e.g., selective or conformal. Further, as described in more detail below, relative dosing can be controlled by controlling a duration of reactant and/or precursor pulses to the reaction chamber.

Selectivity of deposition on first surface material relative to second surface material can be given as a percentage calculated by [(deposition on the first surface)-(deposition on the second surface)]/(deposition on the first surface). Deposition can be measured in any of a variety of ways. For example, deposition may be determined as a measured thickness of the deposited material, or may be determined as a measured amount of material deposited. In accordance with examples of the disclosure, a selectivity during step 104 can be above about 70%, above about 80%, more preferably above 90%, even more preferably above 95%, and most preferably about 100%. In some cases, selectivity above 80% may be acceptable for certain applications. In some cases, selectivity above 50% may be acceptable for certain applications. In accordance with further examples of the disclosure, selectivity is higher with respect to sidewall 220 surface than with respect to top surface 218.

Exemplary molybdenum precursors suitable for use with step 104 include molybdenum halide precursors. The molybdenum halide precursors can include one or more of a molybdenum chloride precursor, a molybdenum iodide precursor, a molybdenum bromide precursor, and the like. For example, a molybdenum halide can be or include molybdenum pentachloride ($MoCl_5$), or the like.

In some embodiments, the molybdenum halide precursor may comprise molybdenum chalcogenide halide precursors.

Exemplary molybdenum chalcogenide halide precursors include a molybdenum oxyhalide precursor selected from the group consisting of: molybdenum oxychloride, molybdenum oxyiodide, and molybdenum oxybromide. In particular embodiments of the disclosure, the molybdenum precursor includes molybdenum (IV) dichloride dioxide ($MoO_2Cl_2$).

A flowrate of the molybdenum precursor to the reaction chamber can be controlled and can be greater than zero and less than 1000 sccm, or less than 500 sccm, or less than 100 sccm, or less than 10 sccm, or even less than 1 sccm. For example, the flowrate can be between about 1 and 2000 sccm, between about 5 and 1000 sccm, or between about 10 and about 500 sccm. In some embodiments of the disclosure, for example, in the case of cyclical processes, the molybdenum precursor is pulsed to the reaction chamber. In such cases, the reactant and/or an inert gas can be supplied continuously or can be pulsed. A duration of each precursor pulse can be between about 0.1 seconds and about 60 seconds, between about 0.1 seconds and about 10 seconds, or between about 0.5 seconds and about 5.0 seconds, or even between 0.1 seconds and 1 second.

As noted above, precursors may be purged from the reaction chamber—e.g., after each pulse and/or upon completion of a deposition step. A purge can be effected either in time or in space, or both. For example, in the case of temporal purges, a purge step can be used, e.g., in the temporal sequence of providing a precursor to a reactor chamber, ceasing a flow of the precursor to the reaction chamber, providing a purge gas to the reactor chamber, and providing a reactant to the reactor chamber, wherein the substrate on which a material is deposited does not move. As noted herein, in some cases, the reactant can be used as a purge gas when the precursor is not flowing to the reaction chamber. In the case of spatial purges, a purge step can take the following form: moving a substrate from a first location to which a first precursor is (e.g., continually) supplied, through a purge gas curtain, to a second location to which a second precursor is (e.g., continually) supplied. Purging times may be, for example, from about 0.01 seconds to about 20 seconds, from about 0.05 seconds to about 20 seconds, or from about 1 second to about 20 seconds, or from about 0.5 seconds to about 10 seconds, or between about 1 second and about 7 seconds.

Exemplary (e.g., first) reactants suitable for use with step 104 include reducing agents. Exemplary reducing agents include one or more of forming gas ($H_2+N_2$), ammonia ($NH_3$), hydrazine ($N_2H_4$), an alkyl-hydrazine (e.g., tertiary butyl hydrazine ($C_4H_{12}N_2$)), molecular hydrogen ($H_2$), hydrogen atoms (H), a hydrogen plasma, hydrogen radicals, hydrogen excited species, (e.g., C1-C4) alcohols, (e.g., C1-C4) aldehydes, (e.g., C1-C4) carboxylic acids, (e.g., B1-B12) boranes, or an amine. By way of particular examples, the first reactant can be or include at least one of hydrogen ($H_2$), silane ($SiH_4$), disilane ($Si_2H_6$), trisilane ($Si_3H_8$), germane ($GeH_4$), digermane ($Ge_2H_6$), borane ($BH_3$), or diborane ($B_2H_6$).

A flowrate of the reactant to the reaction chamber can be greater than zero and less than 100 slm, or less than 15 slm, or less than 10 slm, or less than 5 slm, or less than 1 slm, or even less than 0.1 slm. For example, the flowrate can be between about 0.1 to 30 slm, from about 5 to 15 slm, or equal to or greater than 10 slm. In the case of cyclical deposition processes, the reactant can be pulsed—e.g., for a duration between about 0.01 seconds and about 180 seconds, between about 0.05 seconds and about 60 seconds, or between about 0.1 seconds and about 30 seconds. As noted herein, in some cases, the reactant can be continuously flowed through one or more deposition cycles.

In some cases, a purge can be employed to remove any excess reactant and/or reaction byproducts from a reaction chamber—e.g., after a reactant pulse and/or at a completion of a deposition step. The purge can be as described above.

It should be appreciated that in some embodiments of the disclosure, the order providing the precursor and the reactant can be reversed. In some cases, the steps of providing the precursor and the reactant can overlap. In addition, in some embodiments, a cyclical process can include providing a precursor one or more times prior to providing the reactant one or more times. Alternatively, in some embodiments, a cyclical deposition process includes providing the reactant one or more times prior to providing the precursor one or more times.

Figure 3:
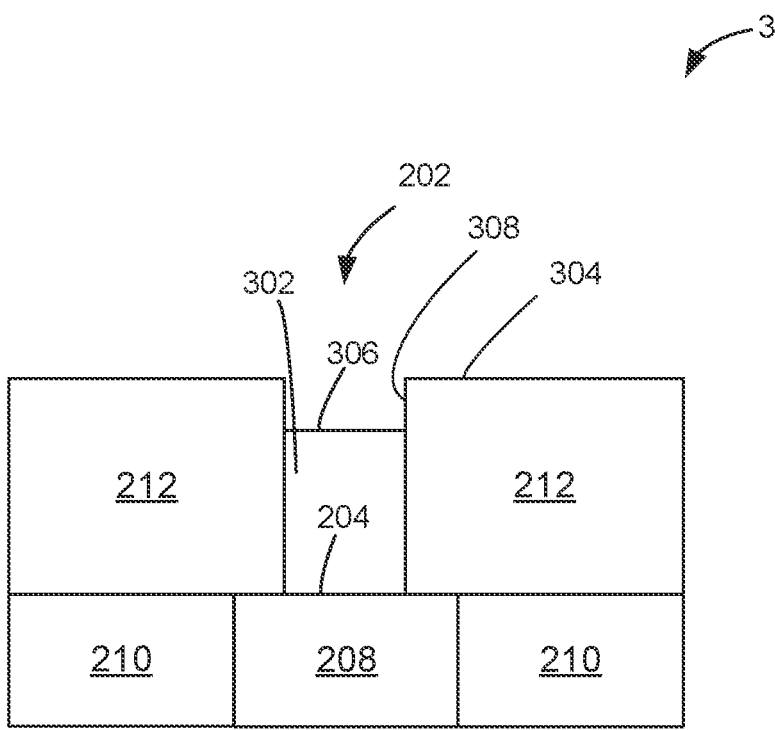
FIGS. 3 and 4 illustrate structures in accordance with further embodiments of the disclosure.

FIG. 3 illustrates a structure 300 after completion of step 104. As illustrated, Structure 300 includes substrate 200 and a first material 302 comprising molybdenum. First material 302 comprising molybdenum can at least partially fill the volume of gap 202. For example, about 10 to about 50 or about 50 to about 90 or about 50 to about 100 percent of the volume can be filled with material 302 comprising molybdenum using step 104.

Figure 4:
Figure 4:
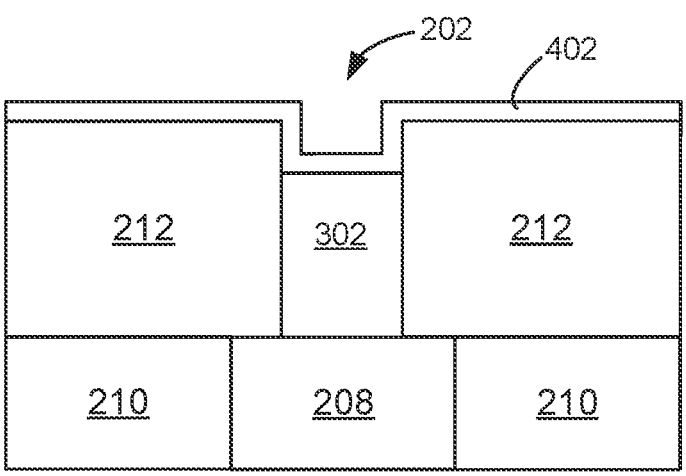

Referring now to FIGS. 1 and 4, after the step 104 of selectively depositing the first material 302 comprising molybdenum, method 100 includes step 106 of conformally depositing a second material 402 comprising molybdenum over the first surface (e.g., first surface 204) and the second surface (e.g., second surface 206). A combination of the first material 302 comprising molybdenum and the second material 402 comprising molybdenum can be referred to collectively as gap-fill material.

Method 100 can switch from step 104 to step 106 after a predetermined amount of deposition time, after a predetermined number of deposition cycles, or the like. In some cases, such as when a reactant dose:molybdenum precursor dose (e.g., in torr*s) ratio is between about $1\times10^5$ and $1\times10^7$ or about $1\times10^6$ and $9\times10^6$, method 100 automatically switches between the steps of selectively depositing the first material 302 comprising molybdenum and conformally depositing a second material 402 comprising molybdenum—e.g., without changing the process recipe.

Using a conformal process (e.g., to form material 402, illustrated in FIG. 4) to cap the first material 302 comprising molybdenum can be advantageous to obtain a desired (e.g., low) contact resistance, while also reducing problems associated with sidewall adhesion of the first material 302 comprising molybdenum and/or to mitigate issues (e.g., uneven film thickness) associated with via-to-via size variation. The improved (increased) sidewall adhesion can reduce damage or roughness from subsequent etching steps that might otherwise occur. Further, seams in the gap-fill material that might otherwise form can be reduced or eliminated. Further, a throughput of method 100 can be relatively high, compared to a method that only includes selective deposition. Yet further, deposition of conformal material can mitigate mushroom-like growth of the material comprising molybdenum that would otherwise occur. Such mushroom-like growth can be problematic in subsequent processing steps.

Similar to step 104, step 106 can include providing a (e.g., second) molybdenum precursor to the reaction chamber and providing a (e.g., second) reactant to the reaction chamber. The second molybdenum precursor can be or include any molybdenum precursor noted above. For example, the first molybdenum precursor and the second molybdenum precursor can comprise the same or different molybdenum compounds. Similarly, the second reactant can be or include any of the same or different reactants noted above. Flowrates, pulse durations, reaction chamber pressures, and reaction chamber temperatures can be as noted above. And, similar to step 104, step 106 can be a cyclic process or can be a CVD process.

To obtain a desired conformality of deposited second material comprising molybdenum, a second dose ratio of a dose of the second reactant to a dose of the second molybdenum precursor is between about 500 and about 500,000 or between about 5000 and about 50,000. In accordance with examples of the disclosure, the first dose ratio differs from the second dose ratio. The first dose ratio can be higher or lower than the second dose ratio.

Figure 6:
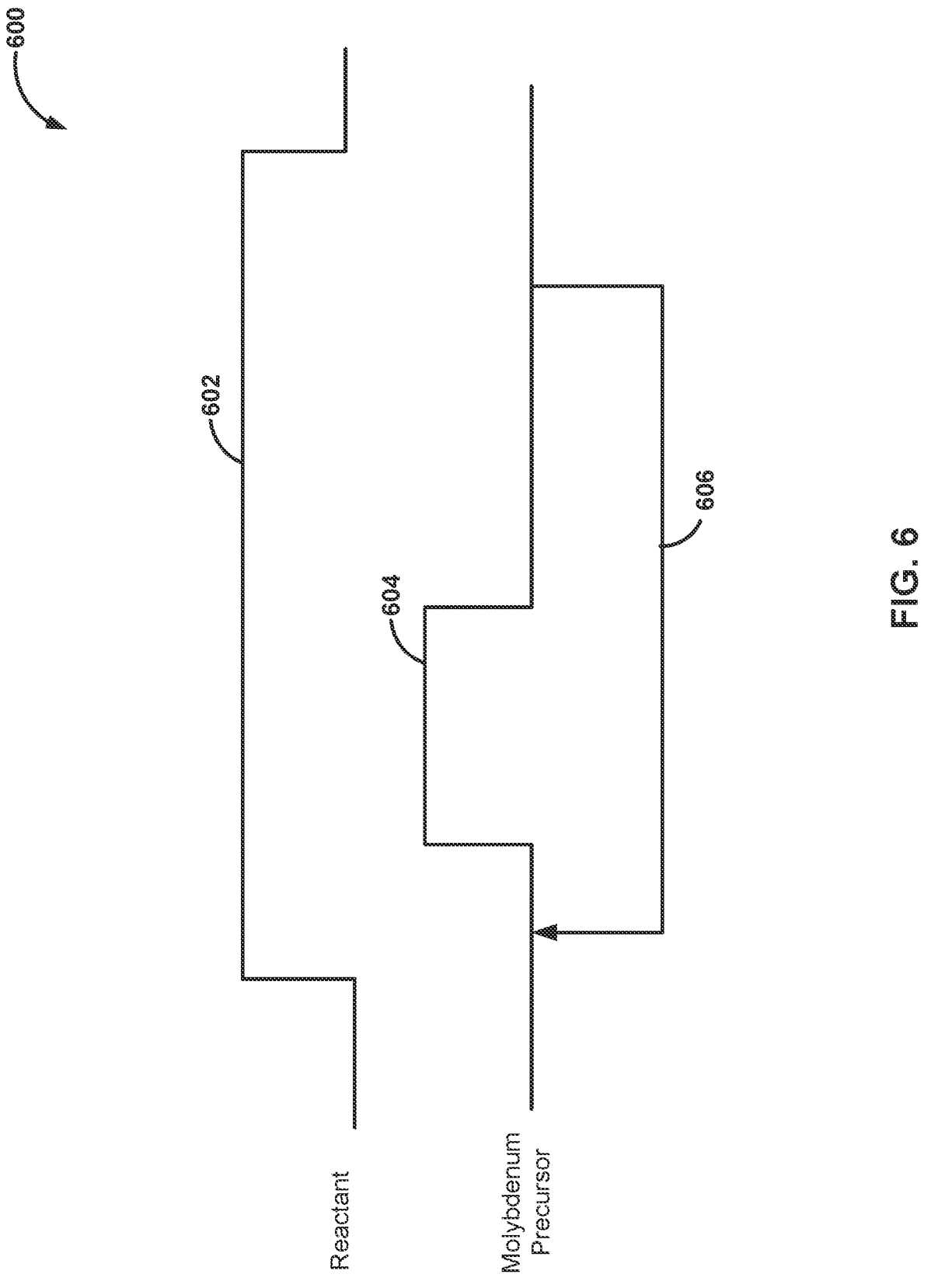
FIG. 6 illustrates a timing sequence suitable for use with a method in accordance with examples of the disclosure.

FIG. 6 illustrates an exemplary timing sequence 600 suitable for use with examples of method 100. Sequence 600 illustrates a pulsed CVD process that can be used in connection with steps 104 and/or 106. As noted above, in some cases, steps 104 and 106 can be substantially the same (e.g., flowrates and/or pulse durations and the like for the respective reactants and precursors can be within ±10%, ±5%, ±2% or, ±1%).

Timing sequence 600 includes a reactant duration line 602 and a molybdenum precursor pulse line 604. Timing sequence 600 also includes a repeat loop 606. Repeat loop 606 can be considered a deposition cycle. As illustrated, timing sequence 600 can include continuously providing a reactant during one or more deposition cycles, while pulsing the molybdenum precursor.

In accordance with other examples of the disclosure, steps 104 and/or 106 can include ALD or other cyclical processes.

FIG. 4 illustrates a structure 400 that includes structure 300 and conformally deposited second material 402 comprising molybdenum over the first surface 204 and the second surface 206. The second material comprising molybdenum 402 can at least partially fill gap 202. In some cases, the second material 402 comprising molybdenum can fill the remaining volume of gap 202 (e.g., above a surface 306 of first material 302 comprising molybdenum) and extend beyond a surface 304 of structure 300. In accordance with examples of the disclosure, about 50 to about 90 percent, or about 10 to about 50 percent, or about 0 to about 50 percent of the volume is filled using the step of conformally depositing the second material 106.

In some embodiments, a step coverage of the second material 402 comprising molybdenum within gap 202 (e.g., overlying surface 306 and 304) may be equal to or greater than about 50%, or greater than about 80%, or greater than about 90%, or greater than about 95%, or greater than about 98%, or even above 100%. In this context, step coverage can be defined as a thickness of material deposited on surface 308 (e.g., above surface 306) divided by a thickness of material deposited on surface 306 and/or a thickness of material deposited on surface 304 divided by a thickness of material deposited on surface 306.

In some embodiments of the disclosure, a material comprising molybdenum (e.g., the first material comprising molybdenum and the second material comprising molybdenum) exhibits electrical resistivity of less than 3000 $\mu\Omega$-cm, or less than 1000 $\mu\Omega$-cm, or less than 500 $\mu\Omega$-cm, or less than 200 $\mu\Omega$-cm, or less than 100 $\mu\Omega$-cm, or less than 50 $\mu\Omega$-cm, or less than 25 $\mu\Omega$-cm, or less than 15 $\mu\Omega$-cm, or even less than 10 $\mu\Omega$-cm. A thickness of the material comprising molybdenum can be greater than zero and less than 100 Angstroms and the material comprising molybdenum can exhibit an electrical resistivity of less than 35

$\mu\Omega$-cm. As a further non-limiting example, a material comprising molybdenum can have a thickness of greater than zero and less than 200 Angstroms and the material comprising molybdenum can exhibit an electrical resistivity of less than 25 $\mu\Omega$-cm.

In accordance with further examples of the disclosure, a grain size of the first material 302 comprising molybdenum is greater than a grain size of the second material 402 comprising molybdenum. For example, a grain size of the first material 302 comprising molybdenum can be between about 10 Å and about 50 Å or about 50 Å and about 2000 Å. Additionally or alternatively, a grain size of the second material 402 comprising molybdenum can be between about 1 Å and about 5 Å or between about 10 Å and about 2000 Å. In some cases, the grain size of the first material 302 is about the same dimension (e.g., a height, width, and/or depth) of a gap, such as gap 202. In some cases, the grain size of the first material 302 is about one quarter, one third or about one half to about one relative to a dimension of the gap.

With reference again to FIG. 1, method 100 can include a step 108 of cleaning the surface of the substrate (e.g., the first surface 204 and/or the second surface 206) prior to the step of selectively depositing the first material 302.

In accordance with examples of the disclosure, step 108 may include a plasma process. The plasma process can include a direct, indirect, or remote plasma process. An exemplary plasma cleaning process can include providing one or more cleaning reactants—e.g., selected from one or more of the group consisting of Hz, a mixture of $N_2$ and $H_2$, and Ar, and forming excited species from the one or more cleaning reactants.

Additionally or alternatively, the step of cleaning may comprise a thermal process. During a thermal cleaning process, a plasma may not be used to form excited species. Exemplary cleaning reactants suitable for use during a thermal cleaning process include one or more of $H_2$, $MoCl_5$, $WCl_5$, and any combination of metal chloride species. To mitigate any possible reoxidation of the surface, exemplary cleaning reactants may not include an oxidant or oxygen-containing compound.

Figure 5:
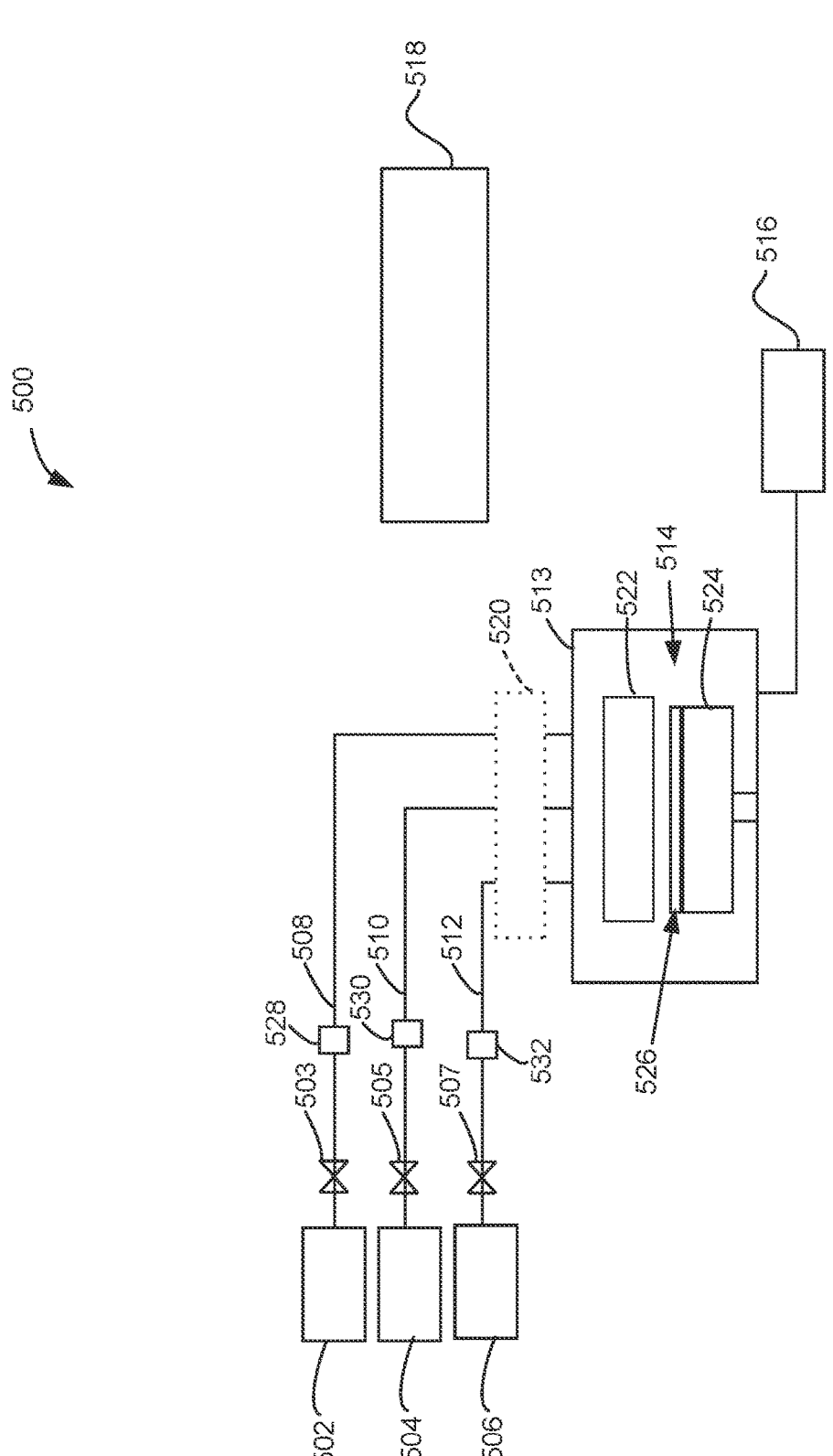
FIG. 5 illustrates a system in accordance with yet additional embodiments of the disclosure.

Turing now to FIG. 5, a system 500 for filling a gap on a surface of a substrate, in accordance with exemplary embodiments of the disclosure, is illustrated. The system 500 can be used to perform a method as described herein and/or form a structure as described herein.

In the illustrated example, the system 500 includes one or more reactors 513—each including one or more reaction chambers 514—a precursor source 502 in fluid communication via a first flow control valve 503 and line 508 with the one or more reaction chambers 514, a reactant source 504 in fluid communication via a second flow control valve 505 and line 510 with the one or more reaction chambers 514, a purge source 506 in fluid communication via a third flow control valve 507 and line 512 with the one or more reaction chambers 514, an exhaust source 516, and a controller 518. The system 500 can optionally include a remote plasma source 520 and/or a direct plasma source to excite a gas (e.g., during a cleaning or deposition step) from one or more sources 502-506 or another gas source. Further, as illustrated, system 500 can include one or more pressure flow controllers or mass flow controllers 528-532 associated with lines 508-512, respectively.

The reaction chamber 514 can include any suitable reaction chamber, such as an atomic layer deposition (ALD) or chemical vapor deposition (CVD) reaction chamber. The reaction chamber 514 can include a gas distribution system 522, such as a showerhead (which can form part of a direct or indirect plasma electrode), and a susceptor 524 to retain a substrate 526.

The exhaust source 516 can include one or more vacuum pumps to remove gas from the reaction chamber 514. The substrate 526 can be any substrate or structure described herein.

The precursor source 502 can include a vessel and a molybdenum precursor, such as one or more molybdenum precursors described herein.

The reactant source 504 can include a vessel and a reactant. The reactant can be or include a reducing agent as described herein.

The purge source 506 can include a vessel and one or more purge gases. For example, purge source 506 can include one or more of nitrogen, argon, or the like.

The controller 518 can include electronic circuitry and software to selectively operate flow control valves 503-507, manifolds, heaters, pumps, and other components included in system 500. Such circuitry and components can operate to introduce precursors, reactants, and purge gases from the respective sources 502-506. The controller 518 can control timing of gas pulse sequences, temperature of the substrate and/or reaction chamber, pressure within the one or more reaction chambers 514, and various other operations to provide proper operation of system 500. The controller 518 can include software to electrically or pneumatically operate flow control valves to provide the precursors from the precursor source 502 and the reactant from reactant source 504, into the one or more reaction chambers 514. The controller 518 can also include software to provide purge gases into and out of the one or more reaction chambers 514.

The controller 518 can include modules, such as a software or hardware component, e.g., a FPGA or ASIC, which perform certain tasks. A module can advantageously be configured to reside on the addressable storage medium of the control system and be configured to execute one or more processes.

By way of examples, the controller 518 can be configured to operate flow control valves and heaters to: selectively deposit a first material comprising molybdenum on a first surface at a bottom of a gap on a substrate relative to a second surface on a sidewall of the gap to at least partially fill the gap and after the step of selectively depositing the first material comprising molybdenum, conformally deposit a second material comprising molybdenum over the first surface and a second surface within the gap.

Other configurations of the system 500 are possible, including different numbers and kinds of precursor and reactant sources and purge gas sources. For example, the reaction chamber, coupled downstream from the first and second flow control valves and responsive to the controller, can be configured to: receive a molybdenum precursor from the molybdenum precursor source and a reactant from the reactant source; selectively deposit a first material comprising molybdenum on a first surface at a bottom of a gap on a substrate relative to a second surface on a sidewall of the gap to at least partially fill the gap according to the received molybdenum precursor and the reactant; and after the step of selectively depositing the first material comprising molybdenum, conformally deposit a second material comprising molybdenum over the first surface and a second surface within the gap according to the received molybdenum precursor source and the reactant source. Further, it will be appreciated that there are many arrangements of valves, conduits, precursor sources, and purge gas sources that may be used to accomplish the goal of selectively feeding gases into the one or more reaction chambers 514. Further, as a schematic representation of an apparatus, many components have been omitted for simplicity of illustration; such components may include, for example, various valves, manifolds, purifiers, heaters, containers, vents, and/or bypasses.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method of forming a structure, the method comprising the steps of:
    providing a substrate within a reaction chamber, the substrate comprising a gap, the gap comprising a volume, a first surface at a bottom of the gap and a second surface on a sidewall of the gap;
    selectively depositing a first material comprising molybdenum on the first surface relative to the second surface to at least partially fill the gap; and
    after the step of selectively depositing the first material comprising molybdenum, conformally depositing a second material comprising molybdenum over the first surface and the second surface,
    wherein one or more of the selectively depositing the first material and conformally depositing a second material comprise a pulsed chemical vapor deposition process.

2. The method of claim 1, wherein the first surface comprises a metal.

3. The method of claim 1, wherein the first material comprises a metal nitride.

4. The method of claim 1, wherein the second surface comprises dielectric material.

5. The method of claim 4, wherein the dielectric material comprises an oxide.

6. The method of claim 4, wherein the dielectric material comprises a low-k dielectric material.

7. The method of claim 1, wherein the step of selectively depositing the first material comprising molybdenum comprises:
    pulsing a first molybdenum precursor to the reaction chamber; and
    continually providing a first reactant to the reaction chamber,
    wherein a first dose ratio of a dose of the first reactant to a dose of the first molybdenum precursor is between about 2000 and about 5000.

8. The method of claim 7, wherein the step of conformally depositing the second material comprises:
    pulsing a second molybdenum precursor to the reaction chamber; and
    continually providing a second reactant to the reaction chamber,
    wherein a second dose ratio of a dose of the second reactant to a dose of the second molybdenum precursor is between about 5000 and about 50,000.

9. The method of claim 8, wherein one or more of the first molybdenum precursor and the second molybdenum precursor are selected from the group consisting of MoCl₅, molybdenum iodide, molybdenum bromide, or a molybdenum chalcogenide halide comprising sulfur, selenium, or tellurium.

10. The method of claim 8, wherein the first reactant comprises a C1-C4 alcohol, a C1-C4 aldehyde, a C1-C4carboxylic acid, a B1-B12 borane, an amine, silane, disilane, trisilane, germane, or digermane.

11. The method of claim 8, wherein the first dose ratio differs from the second dose ratio.

12. The method of claim 8, wherein the first dose ratio is controlled by controlling a duration of precursor pulses.

13. The method of claim 1, further comprising a step of cleaning the surface of the substrate prior to the step of selectively depositing the first material.

14. The method of claim 13, wherein the step of cleaning comprises a plasma process.

15. The method of claim 13, wherein the step of cleaning comprises a thermal process.

16. The method of claim 13, wherein the step of cleaning comprises providing a cleaning reactant selected from the group consisting of $H_2$, a mixture of $N_2$ and $H_2$, and Ar to the reaction chamber.

17. The method of claim 1, wherein a grain size of the first material comprising molybdenum is greater than a grain size of the second material comprising molybdenum.

18. The method of claim 1, wherein about 10 to about 50 percent of the volume is filled using the step of selectively depositing a first material.

19. A structure comprising:
a substrate comprising a gap, the gap comprising a volume, a bottom surface and a side surface adjacent the bottom surface, the bottom surface comprising a first material and the side surface comprising a second material different than the first material;
a first molybdenum layer selectively formed overlying the first surface within the gap, the first molybdenum layer comprising a first grain size and filling about 10 to about 50 percent of the volume; and
a second molybdenum layer conformally formed overlying the first molybdenum layer, the second molybdenum layer comprising a second grain size different than the first grain size, wherein the second material comprises silicon carbon nitride.

20. A system for filling a gap on a surface of a substrate, the system comprising:
a controller configured to operate a first flow control valve and a second flow control valve;
a molybdenum precursor source connected to the first flow control valve;
a reactant source connected to the second flow control valve;
a reaction chamber coupled downstream from the first and second flow control valves and responsive to the controller, wherein the reaction chamber is configured to:
receive a molybdenum precursor from the molybdenum precursor source and a reactant from the reactant source;
selectively deposit a first material comprising molybdenum on a first surface at a bottom of a gap on a substrate relative to a second surface on a sidewall of the gap to at least partially fill the gap according to the received molybdenum precursor and the reactant; and
after the step of selectively depositing the first material comprising molybdenum, conformally depositing a second material comprising molybdenum over the first surface and a second surface within the gap according to the received molybdenum precursor and the reactant,
wherein the step of conformally depositing the second material comprises:
pulsing a second molybdenum precursor to the reaction chamber; and
continually providing a second reactant to the reaction chamber,
wherein a dose ratio of a dose of the second reactant to a dose of the second molybdenum precursor is between about 500 and about 500,000, and
wherein the dose ratio is controlled by controlling a duration of pulses of the second molybdenum precursor.

\* \* \* \* \*